United States Patent
Park et al.

(10) Patent No.: US 9,466,427 B2
(45) Date of Patent: Oct. 11, 2016

(54) MULTILAYER CERAMIC COMPONENT AND BOARD HAVING THE SAME

(71) Applicant: SAMSUNG ELECTRO-MECHANICS CO., LTD., Suwong-Si, Gyeonggi-Do (KR)

(72) Inventors: Heung Kil Park, Suwon-Si (KR); Sang Soo Park, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/936,452

(22) Filed: Nov. 9, 2015

(65) Prior Publication Data

US 2016/0203914 A1 Jul. 14, 2016

(30) Foreign Application Priority Data

Jan. 8, 2015 (KR) .................. 10-2015-0002501

(51) Int. Cl.
| | |
|---|---|
| *H01G 4/30* | (2006.01) |
| *H01G 4/012* | (2006.01) |
| *H01G 4/12* | (2006.01) |
| *H05K 1/18* | (2006.01) |

(Continued)

(52) U.S. Cl.
CPC ............. *H01G 4/30* (2013.01); *H01G 4/012* (2013.01); *H01G 4/12* (2013.01); *H01G 4/228* (2013.01); *H01G 4/248* (2013.01); *H05K 1/111* (2013.01); *H05K 1/181* (2013.01); *H01G 2/06* (2013.01); *H01G 2/16* (2013.01)

(58) Field of Classification Search
CPC .......... H01G 4/12; H01G 4/30; H01G 4/248; H01G 4/228; H01G 1/111; H01G 1/181; H01G 2/06; H01G 2/16; H05K 3/301; H05K 3/3431; H05K 3/321; H05K 2201/10015; H05K 2201/10636; H05K 2201/10909; H05K 2201/10946
See application file for complete search history.

(56) References Cited

U.S. PATENT DOCUMENTS

| | | | | | |
|---|---|---|---|---|---|
| 7,331,799 | B1 * | 2/2008 | Lee | .......................... | H01G 2/06 361/306.3 |
| 8,315,035 | B2 * | 11/2012 | Togashi | ................... | H01G 2/06 361/306.1 |

(Continued)

FOREIGN PATENT DOCUMENTS

| | | |
|---|---|---|
| JP | 2003-257784 A | 9/2003 |
| JP | 2004-266110 A | 9/2004 |
| JP | 2010-123614 A | 6/2010 |

*Primary Examiner* — Ishwarbhai B. Patel
*Assistant Examiner* — Paresh Paghadal
(74) *Attorney, Agent, or Firm* — McDermott Will & Emery LLP

(57) ABSTRACT

A multilayer ceramic component includes a multilayer ceramic capacitor including a ceramic body including a plurality of first and second internal electrodes, and first and second external electrodes, an insulating frame including a first horizontal insulating portion disposed on one surface of the ceramic body, second and third horizontal insulating portions, and first and second vertical insulating portions, first and second external conductor electrodes including first and second upper horizontal conductor portions, first and second lower horizontal conductor portions, and first and second vertical conductor portions, first and second internal conductor electrodes, and electrical connecting units connecting the first and second upper horizontal conductor portions and the first and second internal conductor electrodes.

19 Claims, 7 Drawing Sheets

(51) Int. Cl.
  *H05K 1/11*  (2006.01)
  *H01G 4/248*  (2006.01)
  *H01G 4/228*  (2006.01)
  *H01G 2/06*  (2006.01)
  *H01G 2/16*  (2006.01)

(56) References Cited

U.S. PATENT DOCUMENTS

| | | | | |
|---|---|---|---|---|
| 2003/0161089 A1* | 8/2003 | Togashi | ................ | H01G 4/232 361/306.1 |
| 2007/0188267 A1* | 8/2007 | Togashi | ................ | H01G 4/232 333/185 |
| 2008/0297976 A1* | 12/2008 | Togashi | ................ | H01G 4/232 361/306.3 |
| 2008/0297977 A1* | 12/2008 | Togashi | ................ | H01G 4/232 361/306.3 |
| 2010/0123995 A1 | 5/2010 | Otsuka et al. | | |
| 2011/0043963 A1* | 2/2011 | Bultitude | ................ | H01G 2/16 361/321.4 |
| 2014/0055910 A1* | 2/2014 | Masuda | ................ | H01G 4/01 361/303 |

* cited by examiner

MULTILAYER CERAMIC COMPONENT AND BOARD HAVING THE SAME

CROSS-REFERENCE TO RELATED APPLICATION

This application claims the priority and benefit of Korean Patent Application No. 10-2015-0002501 filed on Jan. 8, 2015, with the Korean Intellectual Property Office, the disclosure of which is incorporated herein by reference.

BACKGROUND

The present disclosure relates to a multilayer ceramic component and a board having the same.

Electronic components using a ceramic material include capacitors, inductors, piezoelectric elements, varistors, thermistors, and the like.

A multilayer ceramic capacitor (MLCC), a ceramic electronic component, may be used in various electronic apparatuses due to inherent advantages thereof, such as a small size, high capacitance, and ease in the mounting thereof.

For example, the multilayer ceramic capacitor is a chip-type condenser mounted on the boards of various types of electronic products such as image display devices, for example, liquid crystal displays (LCD), plasma display panels (PDP), or the like, computers, personal digital assistants (PDA), and cellular phones, serving to charge electricity therein or discharge electricity therefrom.

The multilayer ceramic capacitor may have a structure in which a plurality of dielectric layers and internal electrodes interposed between the dielectric layers and having different polarities are alternately stacked.

Here, since the dielectric layers have piezoelectric properties, when a direct current (DC) or alternating current (AC) voltage is applied to the multilayer ceramic capacitor, a piezoelectric phenomenon may occur between the internal electrodes to generate periodic vibrations while a volume of a ceramic body is expanding and contracting depending on a frequency of a signal applied thereto.

These vibrations may be transferred to a board through external electrodes of the multilayer ceramic capacitor and solders connecting the external electrodes and the board to each other, such that the entirety of the board becomes a sound reflecting surface generating vibration sound, commonly known as noise.

The vibration sound may correspond to an audio frequency within a range of 20 to 20,000 Hz which may cause listener discomfort. The vibration sound causing listener discomfort, as described above, is commonly known as acoustic noise.

Further, in recent electronic devices, mechanical components have become relatively silent, such that the acoustic noise generated in multilayer ceramic capacitors as described above may become more apparent.

In a case in which a device is operated in a silent environment, a user may experience acoustic noise as a sound indicating a defect and conclude that a fault has occurred in the device.

In addition, in a device having an audio circuit, acoustic noise may be overlapped with an audio output, such that audio quality of the device may be deteriorated.

SUMMARY

An aspect of the present disclosure may provide a multilayer ceramic component in which acoustic noise may be decreased, and a board having the same.

According to an aspect of the present disclosure, a multilayer ceramic component may include: a multilayer ceramic capacitor including a ceramic body including a plurality of first and second internal electrodes disposed to be alternately exposed to both surfaces of the ceramic body in a length direction, with respective dielectric layers interposed between the plurality of first and second internal electrodes, and first and second external electrodes disposed on both end surfaces of the ceramic body in the length direction, to be connected to the first and second internal electrodes, respectively; an insulating frame including a first horizontal insulating portion disposed on one surface of the ceramic body in a thickness direction, second and third horizontal insulating portions disposed on the other surface of the ceramic body in the thickness direction, respectively, and first and second vertical insulating portions connecting both end portions of the first horizontal insulating portion and end portions of the second and third horizontal insulating portions to each other, respectively, and disposed on both surfaces of the ceramic body in the length direction, respectively; first and second external conductor electrodes including first and second upper horizontal conductor portions disposed to be spaced apart from each other on an outer surface of the first horizontal insulating portion, first and second lower horizontal conductor portions respectively disposed on outer surfaces of the second and third horizontal insulating portions, and first and second vertical conductor portions respectively disposed on outer surfaces of the first and second vertical insulating portions; first and second internal conductor electrodes interposed between upper surfaces of the first and second external electrodes and the first horizontal insulating portion, respectively; and electrical connecting units connecting the first and second upper horizontal conductor portions and the first and second internal conductor electrodes, respectively.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
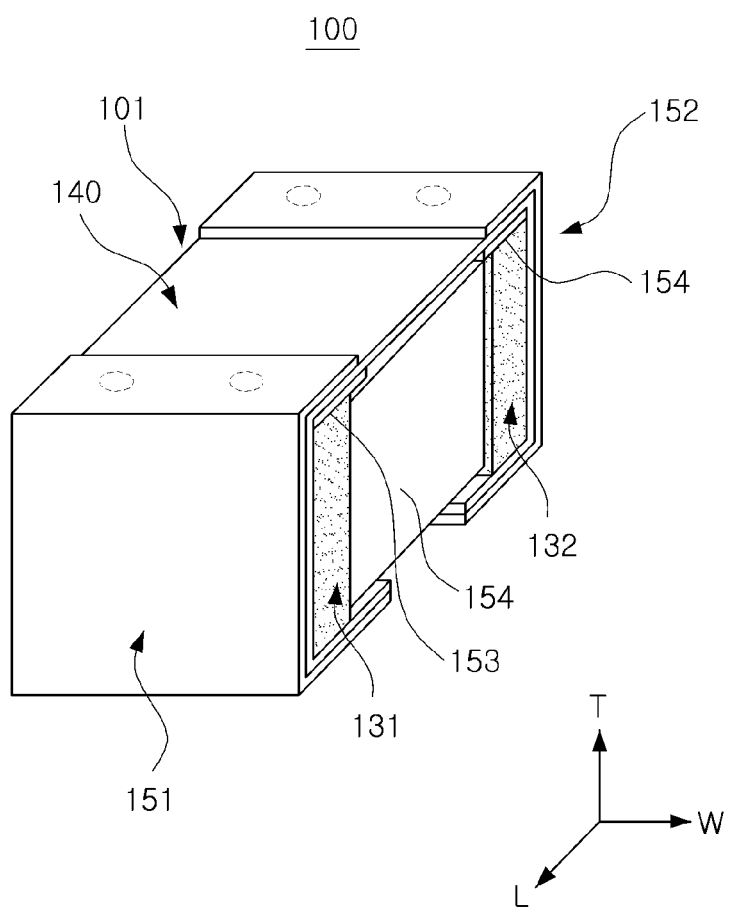
FIG. 1 is a perspective view schematically illustrating a multilayer ceramic component according to an exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Multilayer Ceramic Component

A multilayer ceramic component according to an exemplary embodiment in the present disclosure may include an insulating frame disposed to enclose upper and lower main surfaces of a ceramic body of a multilayer ceramic capacitor and upper and lower surfaces of connected portions and band portions of external electrodes, external conductor electrodes disposed on outer surfaces of the insulating frame, and internal conductor electrodes disposed on inner surfaces of the insulating frame and connected to the external electrodes. The external conductor electrodes and the internal conductor electrodes may be electrically connected from each other.

Here, conductive adhesive layers may be disposed on the internal conductor electrodes and the external electrodes, respectively.

In addition, the external conductor electrodes and the internal conductor electrodes may be electrically connected to each other through via electrodes coupled to the insulating frame to penetrate through the insulating frame or to be electrically connected to each other by forming groove parts in portions of the insulating frame and forming conductive connecting parts in the groove parts.

In addition, portions of the insulating frame may be disposed to be spaced apart from the external electrodes.

Figure 2:
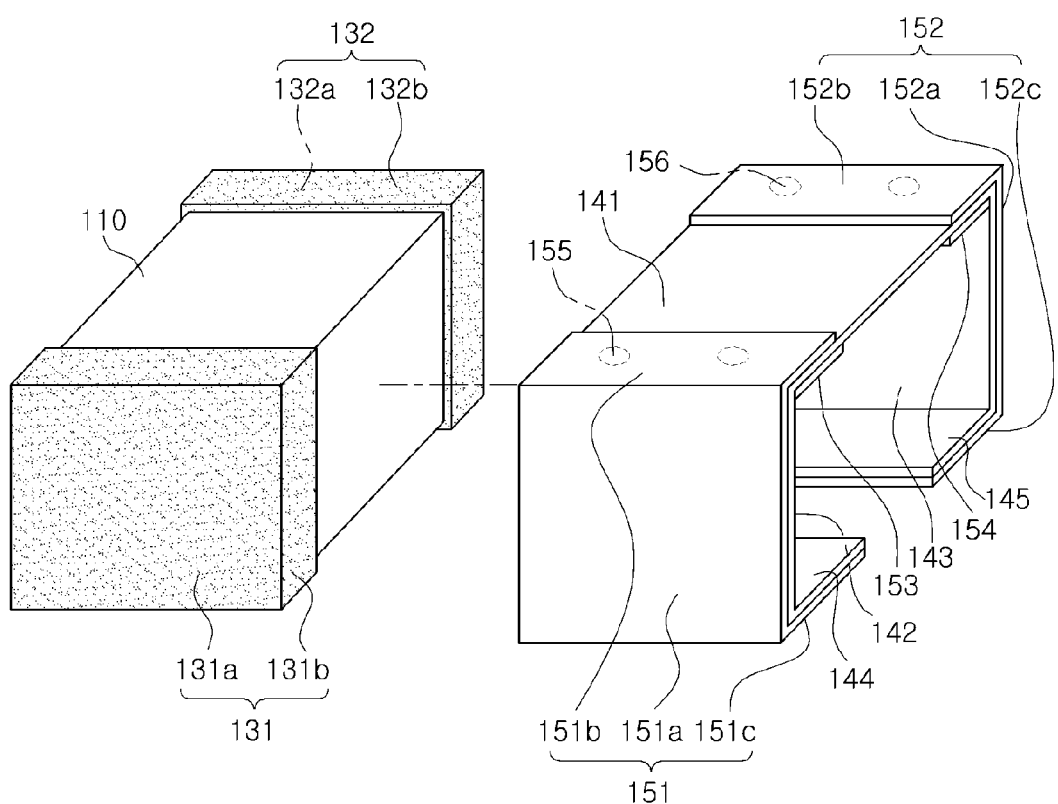
FIG. 2 is an exploded perspective view of the multilayer ceramic component of FIG. 1.
Figure 3:
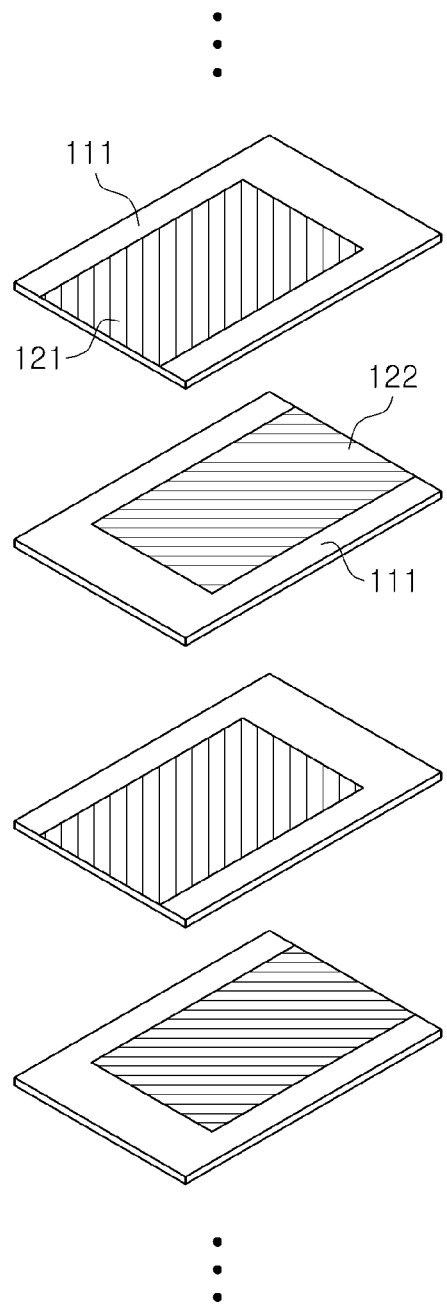
FIG. 3 is an exploded perspective view of the multilayer ceramic component according to an exemplary embodiment in the present disclosure schematically illustrating structures of internal electrodes of a multilayer ceramic capacitor.
Figure 4:
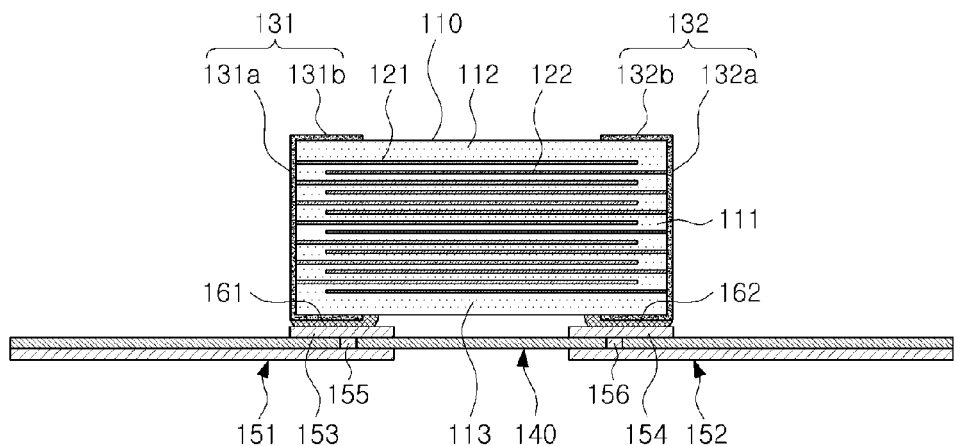
FIGS. 4 and 5 are side cross-sectional views schematically illustrating a method of manufacturing the multilayer ceramic component of FIG. 1.
Figure 5:
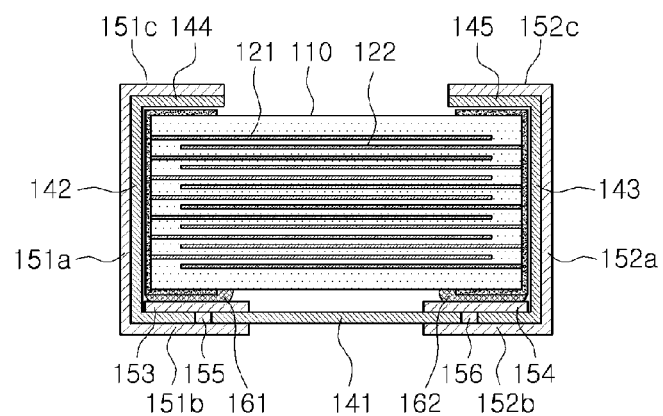
Figure 6:
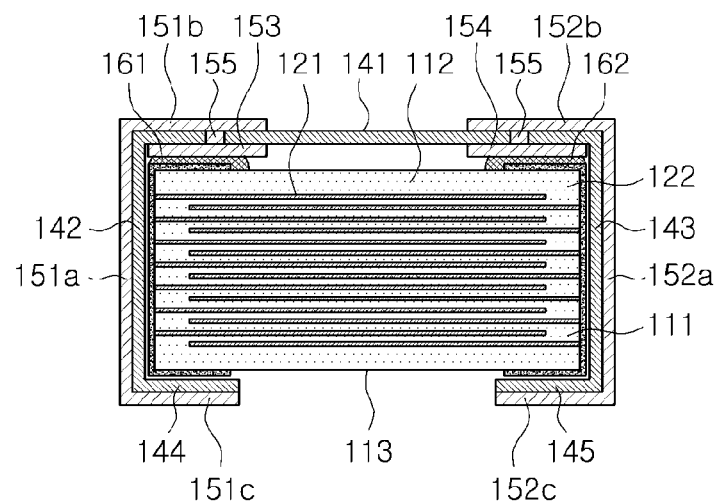
FIG. 6 is a side cross-sectional view of FIG. 1.

FIG. 1 is a perspective view schematically illustrating a multilayer ceramic component according to an exemplary embodiment in the present disclosure, FIG. 2 is an exploded perspective view of the multilayer ceramic component of FIG. 1, FIG. 3 is an exploded perspective view of the multilayer ceramic component according to an exemplary embodiment in the present disclosure schematically illustrating structures of internal electrodes of a multilayer ceramic capacitor, FIGS. 4 and 5 are side cross-sectional views schematically illustrating a method of manufacturing the multilayer ceramic component of FIG. 1, and FIG. 6 is a side cross-sectional view of FIG. 1.

Referring to FIGS. 1 through 6, a multilayer ceramic component 100 according to an exemplary embodiment in the present disclosure may include a multilayer ceramic capacitor 101, an insulating frame 140, first and second external conductor electrodes 151 and 152, first and second internal conductor electrodes 153 and 154, and electrical connecting units connecting the first and second external conductor electrodes 151 and 152 and the first and second internal conductor electrodes 153 and 154 to each other, respectively.

The multilayer ceramic capacitor 101 according to the present exemplary embodiment may include a ceramic body 110 including a plurality of dielectric layers 111 and a plurality of first and second internal electrodes 121 and 122 and first and second external electrodes 131 and 132.

The ceramic body 110 may be formed by stacking a plurality of dielectric layers 111 in a thickness direction T and then sintering the plurality of dielectric layers 111.

Here, respective adjacent dielectric layers 111 of the ceramic body 110 may be integrated with each other so that boundaries therebetween are not readily apparent.

In addition, the ceramic body 110 may have a hexahedral shape. However, a shape of the ceramic body 110 is not limited thereto.

In the present exemplary embodiment, for convenience of explanation, upper and lower surfaces of the ceramic body 110 refer to surfaces of the ceramic body 110 opposing each other in the thickness direction T in which the dielectric layers 111 of the ceramic body 110 are stacked, first and second end surfaces of the ceramic body 110 refer to surfaces of the ceramic body 110 connecting the upper and lower surfaces to each other and opposing each other in a length direction L, and first and second side surfaces of the ceramic body 110 refer to surfaces of the ceramic body 110 vertically intersecting with the first and second end surfaces and opposing each other in a width direction W.

In addition, the ceramic body 110 may have an upper cover layer 112 formed to a predetermined thickness on a first or second internal electrode positioned in the uppermost position of the ceramic body and a lower cover layer 113 formed beneath a first or second internal electrode positioned in the lowermost position of the ceramic body 110.

The upper cover layer 112 and the lower cover layer 113 may be formed of the same composition as that of the dielectric layers 111 and be formed by stacking one or more dielectric layers that do not include internal electrodes on an internal electrode of the ceramic body 110 positioned in the uppermost position of the ceramic body and beneath an internal electrode of the ceramic body 110 positioned in the lowermost position of the ceramic body, respectively.

The dielectric layer 111 may contain a high-k ceramic material, for example, a barium titanate ($BaTiO_3$)-based ceramic powder, or the like. However, a material of the dielectric layer 111 is not limited thereto.

An example of the barium titanate ($BaTiO_3$)-based ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$ and the like, in which Ca, Zr, or the like, is partially dissolved in $BaTiO_3$, but is not limited thereto.

In addition, the dielectric layer 111 may further contain one or more of a ceramic additive, an organic solvent, a plasticizer, a binder, and a dispersant, if necessary.

As the ceramic additive, for example, a transition metal oxide or carbide, a rare earth element, magnesium (Mg), aluminum (Al), or the like, may be used.

The first and second internal electrodes 121 and 122 may be formed on ceramic sheets forming the dielectric layers 111, stacked in the thickness direction T, and then fired, such that they are alternately disposed in the ceramic body 110 in the thickness direction T with respective dielectric layers 111 interposed therebetween.

The first and second internal electrodes 121 and 122, which have different polarities, may be disposed to face each other in a direction in which the dielectric layers 111 are stacked and may be electrically insulated from each other by the dielectric layers 111 disposed therebetween.

One ends of the first and second internal electrodes 121 and 122 may be exposed through first and second end surfaces of the ceramic body 110 in the length direction L, respectively.

In addition, the end portions of the first and second internal electrodes 121 and 122 exposed through the first and second end surfaces of the ceramic body 110 in the length direction L may be electrically connected to the first and second external electrodes 131 and 132, respectively, on the first and second end surfaces of the ceramic body 110 in the length direction L.

Here, the first and second internal electrodes 121 and 122 may be formed of a conductive metal, for example, a material such as nickel, a nickel alloy, or the like. However, materials of the first and second internal electrodes 121 and 122 are not limited thereto.

Therefore, when a voltage having a predetermined level is applied to the first and second external electrodes 131 and 132, electrical charges may be accumulated between the first and second internal electrodes 121 and 122 facing each other. In this case, capacitance of the multilayer ceramic capacitor 101 may be in proportion to an area of a region in which the first and second internal electrodes 121 and 122 are overlapped with each other in the direction in which the dielectric layers 111 are stacked.

The first and second electrodes 131 and 132 may be disposed on opposite end surfaces of the ceramic body 110 in the length direction L, respectively.

In addition, the first and second external electrodes 131 and 132 may include first and second connected portions 131a and 132a and first and second band portions 131b and 132b, respectively.

The first and second connected portions 131a and 132a may be disposed on the first and second end surfaces of the ceramic body 110 in the length direction L, respectively, and may be electrically connected to the exposed end portions of the first and second internal electrodes 121 and 122, respectively.

The first and second band portions 131b and 132b may be extended from the first and second connected portions 131a and 132a, respectively, to cover portions of the lower surface of the ceramic body 110, a mounting surface of the ceramic body 110, or portions of a circumferential surface of the ceramic body 110, and serve to improve adhesive strength of the first and second external electrodes 131 and 132.

Here, plating layers (not illustrated) may be formed on the first and second external electrodes 131 and 132.

The plating layers may include first and second nickel (Ni) plating layers respectively formed on the first and second external electrodes 131 and 132 and first and second tin (Sn) plating layers respectively formed on the first and second nickel plating layers, as an example.

The insulating frame 140 may include first to third horizontal insulating portions 141, 144, and 145, and first and second vertical insulating portions 142 and 143.

The first horizontal insulating portion 141 may be disposed on the upper surface of the ceramic body 110, and the second and third horizontal insulating portions 144 and 145 may be disposed on lower surfaces of the first and second band portions 131b and 132b of the first and second external electrodes 131 and 132, respectively.

Here, the second and third horizontal insulating portions 144 and 145 may be disposed to be spaced apart from the first and second band portions 131b and 132b by a predetermined interval, respectively, if necessary.

In addition, the first and second vertical insulating portions 142 and 143 may connect both end portions of the first horizontal insulating portion 141 and end portions of the second and third horizontal insulating portions 144 and 145 to each other, and be disposed on the first and second end surfaces of the ceramic body 110 in the length direction L, respectively.

Here, the first and second vertical insulating portions 142 and 143 may be disposed to be spaced apart from the first and second connected portions 131a and 132a of the first and second external electrodes 131 and 132 by a predetermined interval, respectively, if necessary.

The insulating frame 140 may be formed of an insulating material having excellent heat resistance and insulation characteristics and having flexibility to be suitable for being bent, for example, a polyimide resin, or the like.

A metal frame structure according to the related art includes a pair of metal frames, which are disposed on left and right external electrodes, respectively, through separate operations. Therefore, a total of two operations were performed.

However, in the present exemplary embodiment, a single insulating frame 140 may be used, and a frame structure may be bonded to the multilayer ceramic capacitor 101 in a single operation, whereby workability may be improved and manufacturing costs may be decreased.

In addition, since the insulating frame 140 according to the present exemplary embodiment is an insulator, when sizes of internal conductor electrodes to be described below are adjusted, a bonding area between the multilayer ceramic capacitor 101 and the insulating frame 140 may be easily controlled, whereby an area in which piezoelectric vibrations generated in the multilayer ceramic capacitor 101 are transferred to the insulating frame 140 and the external conductor electrodes 151 and 152 may be easily adjusted.

The first external conductor electrode 151 may include a first upper horizontal conductor portion 151b, a first lower horizontal conductor portion 151c, and a first vertical conductor portion 151a.

The first upper horizontal conductor portion 151b may be disposed in a position corresponding to the first band portion 131b on an outer surface (upper surface) of the first horizontal insulating portion 141 of the insulating frame 140, the first lower horizontal conductor portion 151c may be disposed at a position corresponding to the first band portion 131b on an outer surface (lower surface) of the second horizontal insulating portion 144 of the insulating frame 140, and the first vertical conductor portion 151a may vertically connect one end portion of the first upper horizontal conductor portion 151b and the first lower horizontal conductor portion 151c to each other and be disposed on an outer surface of the first vertical insulating portion 142 of the insulating frame 140.

Here, the first lower horizontal conductor portion 151c may be subjected to surface treatment such as nickel/tin plating, nickel/gold plating, or the like, so that contact with solders is excellent at the time of mounting the multilayer ceramic capacitor on a board.

The first external conductor electrode 151 as described above may have a substantially '⊏' shape.

The second external conductor electrode 152 may include a second upper horizontal conductor portion 152b, a second lower horizontal conductor portion 152c, and a second vertical conductor portion 152a.

The second upper horizontal conductor portion 152b may be disposed at a position corresponding to the second band portion 132b on an outer surface (upper surface) of the first horizontal insulating portion 141 of the insulating frame 140, the second lower horizontal conductor portion 152c may be disposed at a position corresponding to the second band portion 132b on an outer surface (lower surface) of the third horizontal insulating portion 145 of the insulating frame 140, and the second vertical conductor portion 152a may vertically connect one end portion of the second upper horizontal conductor portion 152b and the second lower horizontal conductor portion 152c to each other and be disposed on an outer surface of the second vertical insulating portion 142 of the insulating frame 140.

Here, the second lower horizontal conductor portion 152c may be subjected to surface treatment such as nickel/tin plating, nickel/gold plating, or the like, so that contact with solders is excellent at the time of mounting the multilayer ceramic capacitor on the board.

The second external conductor electrode 152 as described above may have a substantially '⊃' shape.

In addition, the first and second external conductor electrodes 151 and 152 may be formed of a metal having excellent conductivity, for example, copper, or the like.

In addition, first and second insulating layers (not illustrated) formed of a material such as an epoxy resin, or the like, may be disposed on outer surfaces of the first and second vertical conductor portions 151a and 152a, respectively, if necessary, to control a height of the solder to be low at the time of mounting the multilayer ceramic capacitor on the board.

The first internal conductor electrode 153 may be interposed between an upper surface of the first band portion 131b of the first external electrode 131 and the first horizontal insulating portion 141 of the insulating frame 140 and may be electrically connected to the first band portion 131b of the first external electrode 131.

The second internal conductor electrode 154 may be interposed between an upper surface of the second band portion 132b of the second external electrode 132 and the first horizontal insulating portion 141 of the insulating frame 140 and may be electrically connected to the second band portion 132b of the second external electrode 132.

In addition, the first and second internal conductor electrodes 153 and 154 may be formed of a metal having excellent conductivity, the same material as that of the first and second external conductor electrodes 151 and 152, for example, copper, or the like.

The electrical connecting units may be, for example, first and second via electrodes 155 and 156 respectively coupled to the first horizontal insulating portion 141 of the insulating frame 140 to penetrate through the first horizontal insulating portion 141.

The first and second upper horizontal conductor portions 151b and 152b of the first and second external conductor electrodes 151 and 152 and the first and second internal conductor electrodes 153 and 154 may contact exposed both end portions of the first and second via electrodes 155 and 156, respectively, to thereby be electrically connected to each other.

According to the present exemplary embodiment, since the external conductor electrodes and the internal conductor electrodes are integrated with one insulating frame 140, a manufacturing process may be simplified as compared with a case in which respective internal conductor electrodes, the insulating frame, and the external conductor electrodes is bonded to a pair of external electrodes included in the multilayer ceramic capacitor 101, such that manufacturing efficiency may be improved.

Meanwhile, first and second conducive adhesive layers 161 and 162 may be interposed between the upper surfaces of the first and second band portions 131b and 132b of the first and second external electrodes 131 and 132 and the first and second internal conductor electrodes 153 and 154, respectively, in order to improve bonding strength therebetween.

The first and second conductive adhesive layers 161 and 162 may be formed of, for example, a high melting-point solder or a conductive paste. However, materials of the first and second conductive adhesive layers 161 and 162 are not limited thereto.

Modified Example

Figure 7:
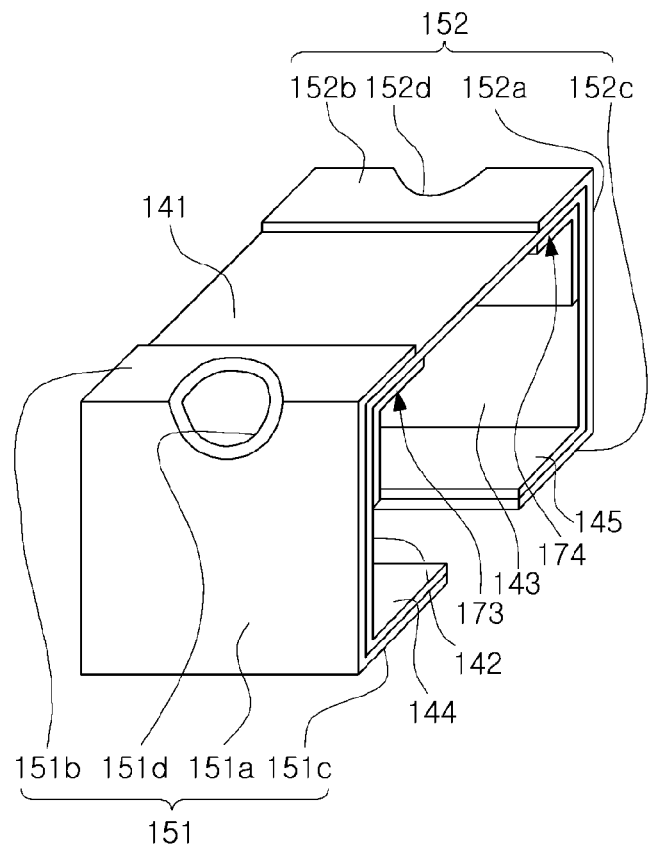
FIG. 7 is a perspective view illustrating a multilayer ceramic component according to another exemplary embodiment in the present disclosure except for a multilayer ceramic capacitor.

FIG. 7 is a perspective view illustrating a multilayer ceramic component according to another exemplary embodiment in the present disclosure except for a multilayer ceramic capacitor.

Here, a detailed description of components similar to those of the exemplary embodiment described above will be omitted in order to avoid overlapped descriptions, and features modified from those of the exemplary embodiment described above will be described in detail.

Referring to FIG. 7, as electric connecting units according to the present exemplary embodiment, first and second groove parts penetrating through both of the first and second upper horizontal conductor portions 151b and 152b of the first and second external conductor electrodes 151 and 152 and the first horizontal insulating portion 141 of the insulating frame 140 may be formed, and first and second conductive connecting parts 151d and 152d formed of a conductive material may be formed in the first and second groove parts, respectively. The first and second external conductor electrodes 151 and 152 and first and second internal conductor electrodes 173 and 174 may be connected to each other by the conductive connecting parts 151d and 152d, respectively.

In addition, the first and second internal conductor electrodes 173 and 174 may be bent to cover the upper surfaces of the first and second band portions 131b and 132b of the first and second external electrodes 131 and 132 and portions of the first and second connected portions 131a and 132a, respectively, as another exemplary embodiment.

Here, the first and second groove parts may be formed in locations in which the first and second upper horizontal conductor portions 151b and 152b of the first and second external conductor electrodes 151 and 152 and the first and second vertical conductor portions 151a and 152a are connected to each other and locations in which the first horizontal insulating portion 141 and the first and second vertical insulating portions 142 and 143 of the insulating frame 140 are connected to each other, respectively, if necessary.

Figure 8:
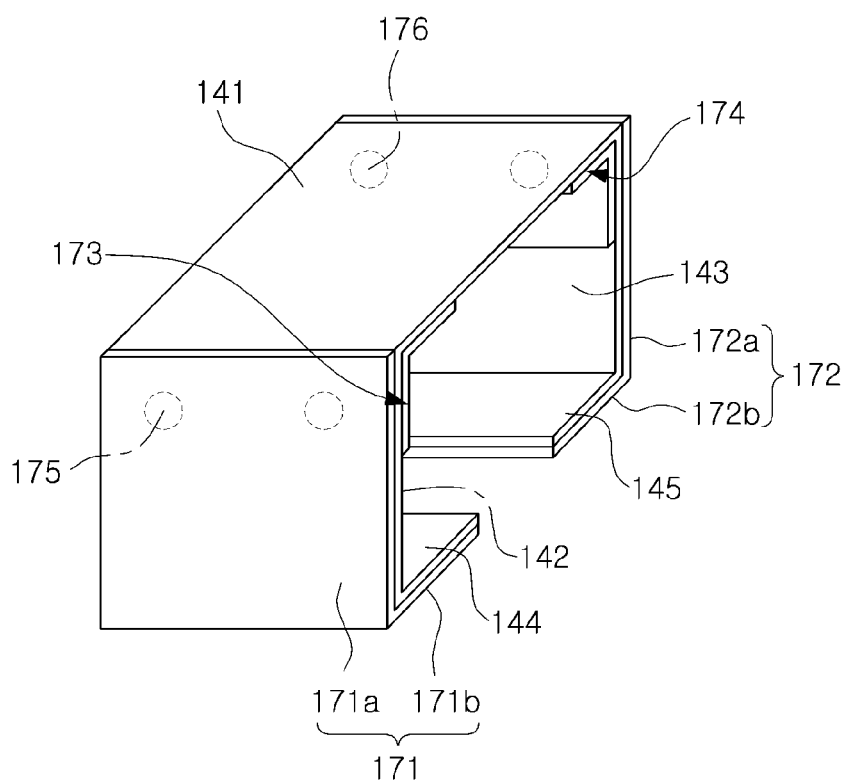
FIG. 8 is a perspective view illustrating a multilayer ceramic component according to another exemplary embodiment in the present disclosure except for a multilayer ceramic capacitor.
Figure 9:
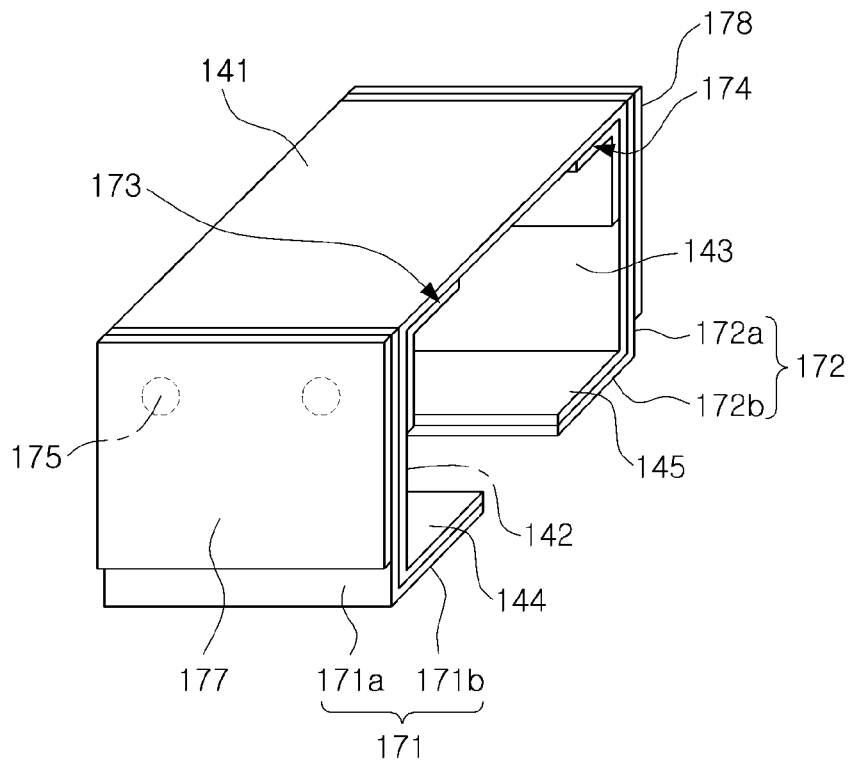
FIG. 9 is a perspective view illustrating a multilayer ceramic component according to another exemplary embodiment in the present disclosure except for a multilayer ceramic capacitor.

FIG. 8 is a perspective view illustrating a multilayer ceramic component according to another exemplary embodiment in the present disclosure except for a multilayer ceramic capacitor, and FIG. 9 is a perspective view illustrating a multilayer ceramic component according to another exemplary embodiment in the present disclosure except for a multilayer ceramic capacitor.

Here, a detailed description of components similar to those of the exemplary embodiment described above will be omitted in order to avoid an overlapped description, and features modified from those of the exemplary embodiment described above will be described in detail.

Referring to FIGS. 8 and 9, a first external conductor electrode 171 according to the present exemplary embodiment may include a first lower horizontal conductor portion 171b and a first vertical conductor portion 171a.

The first lower horizontal conductor portion 171b may be disposed at a position corresponding to the first band portion 131b on an outer surface (lower surface) of the second horizontal insulating portion 144, and the first vertical conductor portion 171a may be vertically bent and extended from one end portion of the first lower horizontal conductor portion 171b and be disposed on an outer surface of the first vertical insulating portion 142 of the insulating frame 140.

Here, the first lower horizontal conductor portion 171b may be subjected to surface treatment such as nickel/tin plating, nickel/gold plating, or the like, so that contact with solders is excellent at the time of mounting the multilayer ceramic capacitor on a board.

The first external conductor electrode 171 as described above may have a substantially 'L' shape.

The second external conductor electrode 172 may include a second lower horizontal conductor portion 172b and a second vertical conductor portion 172a.

The second lower horizontal conductor portion 172b may be disposed at a position corresponding to the second band portion 132b on an outer surface (lower surface) of the third horizontal insulating portion 145, and the second vertical conductor portion 172a may be bent vertically and extended from one end portion of the second lower horizontal conductor portion 172b and be disposed on an outer surface of the second vertical insulating portion 143 of the insulating frame 140.

Here, the second lower horizontal conductor portion 171b may be subjected to a surface treatment such as nickel/tin plating, nickel/gold plating, or the like, so that contact with solders is excellent at the time of mounting the multilayer ceramic capacitor on a board.

The second external conductor electrode 172 as described above may have a substantially 'L' shape.

In addition, the first and second internal conductor electrodes 173 and 174 may be bent to cover the upper surfaces of the first and second band portions 131b and 132b of the first and second external electrodes 131 and 132 and portions of the first and second connected portions 131a and 132a, respectively, as another exemplary embodiment.

In addition, the electrical connecting units may be first and second via electrodes 175 and 176 coupled to the first and second vertical insulating portions 142 and 143 of the insulating frame 140, respectively, to penetrate through the first and second vertical insulating portions 142 and 143, respectively.

The first and second upper horizontal conductor portions 171b and 172b of the first and second external conductor electrodes 171 and 172 and vertical extended portions of the first and second internal conductor electrodes 173 and 174 may contact exposed both end portions of the first and second via electrodes 176 and 156, respectively, to thereby be electrically connected to each other.

Meanwhile, as electric connecting units according to the present exemplary embodiment, first and second groove parts penetrating through both of the first and second vertical conductor portions 171a and 172a of the first and second external conductor electrodes 171 and 172 and the first and second vertical insulating portions 142 and 143 of the insulating frame 140 may be formed, and first and second conductive connecting parts (not illustrated) formed of a conductive material may be formed in the first and second groove parts, respectively. The first and second external conductor electrodes 171 and 172 and the first and second internal conductor electrodes 173 and 174 may be connected to each other by the conductive connecting parts, respectively.

In addition, first and second insulating layers 177 and 178 formed of a material such as an epoxy resin, or the like, may be disposed on outer surfaces of the first and second vertical conductor portions 171a and 172a, respectively, if necessary, to control a height of the solder to be relatively low at the time of mounting the multilayer ceramic capacitor on the board.

In addition, the first and second insulating layers 177 and 178 may be variously modified, if necessary. For example, the first and second insulating layers 177 and 178 may be formed at a height shorter than that of the first and second vertical conductor portions 171a and 172a.

Board Having Multilayer Ceramic Component

Figure 10:
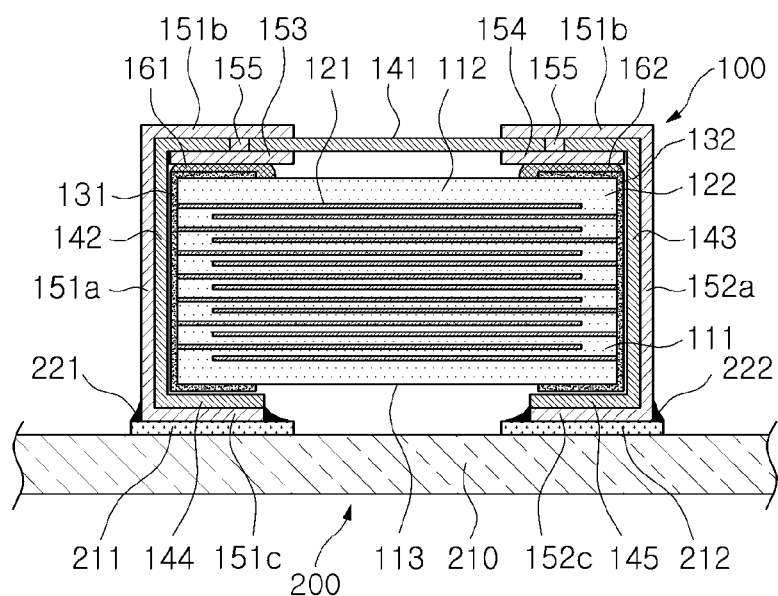
FIG. 10 is aside cross-sectional view illustrating a form in which the multilayer ceramic component of FIG. 1 is mounted on a board.

FIG. 10 is a side cross-sectional view illustrating a form in which the multilayer ceramic component of FIG. 1 is mounted on a board.

Referring to FIG. 10, a board 200 having a multilayer ceramic component according to an exemplary embodiment in the present disclosure may include a circuit board 210 on which the multilayer ceramic component 100 is horizontally mounted and first and second electrode pads 211 and 212 formed on an upper surface of the circuit board 210 to be spaced apart from each other.

In addition, the multilayer ceramic component 100 may be bonded and electrically connected to the circuit board 210 by solders 221 and 222 in a state in which the first and second lower horizontal conductor portions 151c and 152c of the first and second external conductor electrodes 151 and 152 are positioned on the first and second electrode pads 211 and 212, respectively, to contact the first and second electrode pads 211 and 212, respectively.

Meanwhile, the first and second conductive adhesive layers 161 and 162 may be interposed between the upper surfaces of the first and second band portions 131b and 132b or the first and second connected portions 131a and 132a of the first and second external electrodes 131 and 132 and the first and second internal conductor electrodes 153 and 154, respectively.

Here, sizes of the first and second electrode pads 211 and 212 may become indices in determining an amount of solders 221 and 222 connecting the first and second lower horizontal conductor portions 151c and 152c of the multilayer ceramic component and the first and second electrode pads 211 and 212 to each other, respectively, and a magnitude of the acoustic noise may be controlled depending on the amount of the solders 211 and 212.

When voltages having different polarities are applied to the first and second external electrodes 131 and 132 formed on the first and second end surfaces of the ceramic body 110 in the length direction L in a state in which the multilayer ceramic capacitor 101 is mounted on the circuit board 210, the ceramic body 110 may be expanded and contracted in the thickness direction T due to an inverse piezoelectric effect of the dielectric layers 111, and the first and second end surfaces of the ceramic body 110 in the length direction L on which the first and second external electrodes 131 and 132 are formed may be contracted and expanded as opposed to the expansion and the contraction of the ceramic body 110 in the thickness direction T due to the Poisson effect.

The above-mentioned contraction and expansion may generate vibrations, which are transferred from the first and second external electrodes 131 and 132 to the circuit board 210. Therefore, sound may be radiated from the circuit board 210, which becomes the acoustic noise.

In the present exemplary embodiment, mechanical vibrations generated due to piezoelectric properties of the multilayer ceramic capacitor 101 may be partially absorbed by elastic force of the first and second external conductor electrodes 151 and 152 and the insulating frame 140 to decrease an amount of the vibrations transferred to the circuit board 210, thereby decreasing the acoustic noise.

In addition, the first and second external conductor electrodes 151 and 152 and the insulating frame 140 may absorb mechanical stress and external impact generated due to warpage, or the like, of the circuit board to allow the stress not to be transferred to the multilayer ceramic capacitor 101, thereby preventing generation of a crack in the multilayer ceramic capacitor 101.

In addition, according to the present exemplary embodiment, since sufficient elastic force may be obtained by the first and second external conductor electrodes 151 and 152 and the insulating frame 140, even though the second and third horizontal insulating portions 144 and 145 of the insulating frame 140 and the lower surface of the ceramic body 110 contact each other or are spaced apart from each other, a minimum interval may be maintained between the second and third horizontal insulating portions 144 and 145 of the insulating frame 140 and the lower surface of the ceramic body 110, such that a height of the multilayer ceramic component may be further decreased.

As set forth above, according to exemplary embodiment in the present disclosure, elastic force of the external conductor electrodes and the insulating frame may absorb vibrations transferred through the external electrodes of the multilayer ceramic capacitor, thereby decreasing the acoustic noise.

While exemplary embodiments have been shown and described above, it will be apparent to those skilled in the art that modifications and variations could be made without departing from the scope of the present invention as defined by the appended claims.

What is claimed is:

1. A multilayer ceramic component comprising:
   a multilayer ceramic capacitor including a ceramic body including a plurality of first and second internal electrodes disposed to be alternately exposed to opposite surfaces of the ceramic body in a length direction, with respective dielectric layers interposed between the plurality of first and second internal electrodes, and first and second external electrodes disposed on the opposite end surfaces of the ceramic body in the length direction to be connected to the first and second internal electrodes, respectively;
   an insulating frame including a first horizontal insulating portion disposed on one surface of the ceramic body in a thickness direction, second and third horizontal insulating portions disposed on the other surface of the ceramic body in the thickness direction, respectively, and first and second vertical insulating portions connecting opposite end portions of the first horizontal insulating portion and end portions of the second and third horizontal insulating portions to each other, respectively, and disposed on the opposite surfaces of the ceramic body in the length direction, respectively;
   first and second external conductor electrodes including first and second upper horizontal conductor portions disposed to be spaced apart from each other on an outer surface of the first horizontal insulating portion, first and second lower horizontal conductor portions respectively disposed on outer surfaces of the second and third horizontal insulating portions, and first and second vertical conductor portions respectively disposed on outer surfaces of the first and second vertical insulating portions;
   first and second internal conductor electrodes interposed between upper surfaces of the first and second external electrodes and the first horizontal insulating portion, respectively; and
   electrical connecting units connecting the first and second upper horizontal conductor portions and the first and second internal conductor electrodes, respectively.

2. The multilayer ceramic component of claim 1, wherein the first and second external electrodes comprise first and second connected portions respectively formed on the opposite surfaces of the ceramic body in the length direction and first and second band portions respectively extended from the first and second connected portions to cover portions of surfaces of the ceramic body in a width direction and the thickness direction, respectively.

3. The multilayer ceramic component of claim 2, further comprising first and second conducive adhesive layers interposed between the first and second internal conductor electrodes and surfaces of the first and second band portions corresponding to the first and second internal conductor electrodes, respectively.

4. The multilayer ceramic component of claim 3, wherein the first and second conducive adhesive layers are formed of a solder or a conductive paste.

5. The multilayer ceramic component of claim 2, wherein the first and second internal conductor electrodes are extended to cover portions of the first and second connected portions of the first and second external electrodes, respectively.

6. The multilayer ceramic component of claim 1, wherein the electrical connecting units are formed by first and second via electrodes coupled to the first horizontal insulating portion by penetrating through the first horizontal insulating portion.

7. The multilayer ceramic component of claim 6, wherein the first and second groove parts are formed in portions in which the first and second upper horizontal conductor portions and the first and second vertical conductor portions are connected to each other, respectively.

8. The multilayer ceramic component of claim 1, wherein the electrical connecting units comprise first and second groove parts penetrating through the first and second upper horizontal conductor portions and the first horizontal insulating portion, and first and second conductive connecting parts formed in the first and second groove parts, respectively.

9. The multilayer ceramic component of claim 1, wherein the second and third horizontal insulating portions and the first and second vertical insulating portions of the insulating frame are spaced apart from the first and second external electrodes, respectively.

10. The multilayer ceramic component of claim 1, further comprising first and second insulating layers disposed on outer surfaces of the first and second vertical conductor portions, respectively.

11. A multilayer ceramic component comprising:
    a multilayer ceramic capacitor including a ceramic body including a plurality of first and second internal electrodes disposed to be alternately exposed to opposite surfaces of the ceramic body in a length direction, with respective dielectric layers interposed between the plurality of first and second internal electrodes, and first and second external electrodes including first and second connected portions disposed on the opposite surfaces of the ceramic body in the length direction and connected to the first and second internal electrodes, respectively, and first and second band portions extended from the first and second connected portions, respectively, to cover portions of surfaces of the ceramic body in a width direction and a thickness direction;

an insulating frame including a first horizontal insulating portion disposed on one surface of the ceramic body in a thickness direction, second and third horizontal insulating portions disposed on the other surface of the ceramic body in the thickness direction, respectively, and first and second vertical insulating portions connecting opposite end portions of the first horizontal insulating portion and end portions of the second and third horizontal insulating portions to each other, respectively, and disposed on the opposite surfaces of the ceramic body in the length direction, respectively;

first and second external conductor electrodes including first and second lower horizontal conductor portions respectively disposed on outer surfaces of the second and third horizontal insulating portions, and first and second vertical conductor portions respectively disposed on outer surfaces of the first and second vertical insulating portions, respectively;

first and second internal conductor electrodes disposed to cover upper surfaces of the first and second band portions and portions of the first and second connected portions, respectively; and electrical connecting units connecting the first and second upper horizontal conductor portions and the first and second internal conductor electrodes, respectively.

12. The multilayer ceramic component of claim 11, further comprising first and second conducive adhesive layers interposed between the first and second internal conductor electrodes and surfaces of the first and second band portions corresponding to the first and second internal conductor electrodes or the first and second connected portions, respectively.

13. The multilayer ceramic component of claim 11, wherein the electrical connecting units are formed by first and second via electrodes coupled to the first and second vertical insulating portions, respectively, by penetrating through the first and second vertical insulating portions, respectively.

14. The multilayer ceramic component of claim 11, wherein the electrical connecting units comprise first and second groove parts penetrating through the first and second vertical conductor portions and the first and second vertical insulating portions, respectively, and first and second conductive connecting parts formed in the first and second groove parts, respectively.

15. The multilayer ceramic component of claim 11, wherein the second and third horizontal insulating portions and lower portions of the first and second vertical insulating portions of the insulating frame are spaced apart from the first and second external electrodes, respectively.

16. The multilayer ceramic component of claim 11, further comprising first and second insulating layers disposed on outer surfaces of the first and second vertical conductor portions, respectively.

17. A board comprising:

a multilayer ceramic component comprising:

a multilayer ceramic capacitor including a ceramic body including a plurality of first and second internal electrodes disposed to be alternately exposed to opposite surfaces of the ceramic body in a length direction, with respective dielectric layers interposed between the plurality of first and second internal electrodes, and first and second external electrodes disposed on the opposite end surfaces of the ceramic body in the length direction to be connected to the first and second internal electrodes, respectively;

an insulating frame including a first horizontal insulating portion disposed on one surface of the ceramic body in a thickness direction, second and third horizontal insulating portions disposed on the other surface of the ceramic body in the thickness direction, respectively, and first and second vertical insulating portions connecting opposite end portions of the first horizontal insulating portion and end portions of the second and third horizontal insulating portions to each other, respectively, and disposed on the opposite surfaces of the ceramic body in the length direction, respectively;

first and second external conductor electrodes including first and second upper horizontal conductor portions disposed on an outer surface of the first horizontal insulating portion, first and second lower horizontal conductor portions respectively disposed on outer surfaces of the second and third horizontal insulating portions, and first and second vertical conductor portions respectively disposed on outer surfaces of the first and second vertical insulating portions;

first and second internal conductor electrodes interposed between upper surfaces of the first and second external electrodes and the first horizontal insulating portion, respectively; and electrical connecting units connecting the first and second upper horizontal conductor portions and the first and second internal conductor electrodes, respectively; and a circuit board having first and second electrode pads, wherein the multilayer ceramic component is mounted on the circuit board by connecting the first and second electrode pads of the circuit board and the first and second lower horizontal conductor portions of the first and second external conductor electrodes of the multilayer ceramic component to each other, respectively.

18. The board of claim 17, wherein the second and third horizontal insulating portions and the first and second vertical insulating portions of the insulating frame are spaced apart from the first and second external electrodes, respectively.

19. The board of claim 17, wherein the second and third horizontal insulating portions and lower portions of the first and second vertical insulating portions of the insulating frame are spaced apart from the first and second external electrodes, respectively.

* * * * *